United States Patent
Maly et al.

(10) Patent No.: US 6,636,429 B2
(45) Date of Patent: Oct. 21, 2003

(54) EMI REDUCTION IN POWER MODULES THROUGH THE USE OF INTEGRATED CAPACITORS ON THE SUBSTRATE LEVEL

(75) Inventors: Douglas Maly, Canton, MI (US); Sayeed Ahmed, Canton, MI (US); Scott Parkhill, Perrysburg, OH (US); Fred Flett, Bloomfield, MI (US)

(73) Assignee: Ballard Power Systems Corporation, Dearborn, MI (US)

( * ) Notice: Subject to any disclaimer, the term of this patent is extended or adjusted under 35 U.S.C. 154(b) by 0 days.

(21) Appl. No.: 09/957,001

(22) Filed: Sep. 20, 2001

(65) Prior Publication Data

US 2002/0126465 A1 Sep. 12, 2002

Related U.S. Application Data

(60) Provisional application No. 60/233,995, filed on Sep. 20, 2000, provisional application No. 60/233,996, filed on Sep. 20, 2000, provisional application No. 60/233,993, filed on Sep. 20, 2000, provisional application No. 60/233,992, filed on Sep. 20, 2000, and provisional application No. 60/233,994, filed on Sep. 20, 2000.

(51) Int. Cl.$^7$ ................................................. H05K 9/00
(52) U.S. Cl. ...................... 361/818; 361/816; 361/715; 361/723; 257/666; 257/700; 315/194
(58) Field of Search ................................. 361/818, 819, 361/288, 715, 723, 752, 724, 800, 816; 315/194; 257/584, 587, 666, 700; 174/35

(56) References Cited

U.S. PATENT DOCUMENTS

| | | | |
|---|---|---|---|
| 4,661,897 A | 4/1987 | Pitel | 363/17 |
| 4,674,024 A | 6/1987 | Paice et al. | 363/71 |
| 5,172,310 A | 12/1992 | Deam et al. | 363/144 |
| 5,184,291 A | 2/1993 | Crowe et al. | 363/37 |
| 5,264,761 A * | 11/1993 | Johnson | 315/291 |
| 5,459,356 A | 10/1995 | Schulze et al. | 257/773 |
| 5,508,560 A | 4/1996 | Koehler et al. | 257/730 |
| 5,559,374 A | 9/1996 | Ohta et al. | 257/723 |
| 5,635,751 A * | 6/1997 | Ikeda et al. | 257/584 |
| 5,847,951 A | 12/1998 | Brown et al. | 363/147 |
| 6,054,765 A * | 4/2000 | Eytcheson et al. | 257/724 |
| 6,072,707 A | 6/2000 | Hochgraf | 363/71 |
| 6,078,173 A | 6/2000 | Kumar et al. | 324/158.1 |
| 6,212,087 B1 | 4/2001 | Grant et al. | 363/144 |
| 2002/0034088 A1 | 3/2002 | Parkhill et al. | 363/144 |

OTHER PUBLICATIONS

Persson, E., "Power Electronic Design and Layout Techniques for Improved Performance and Reduced EMI," in *Proceedings of Power Electronics In Transportation*, IEEE, Dearborn, MI, Oct. 20–21, 1994, pp. 79–82.

* cited by examiner

*Primary Examiner*—David Martin
*Assistant Examiner*—Hung Bui
(74) *Attorney, Agent, or Firm*—Seed IP Law Group PLLC (57) ABSTRACT

A high frequency, low impedance network is integrated into the substrate level of a power module for the reduction of electromagnetic interference ("EMI"). In one embodiment, capacitance is electrically connected to at least one of the positive conducting layer in a substrate or the negative conducting layer in a substrate and a ground. Integrating a capacitive network of low stray inductance in a substrate of a power module allows relatively small, inexpensive capacitors to be used.

4 Claims, 11 Drawing Sheets

SECTION A-A
FIG. 5

SECTION B-B
FIG. 6

SECTION C-C
FIG. 7

SECTION D-D
FIG. 8

FIG. 9

Section C-C
FIG. 10

EMI REDUCTION IN POWER MODULES THROUGH THE USE OF INTEGRATED CAPACITORS ON THE SUBSTRATE LEVEL

CROSS REFERENCE TO RELATED APPLICATIONS

This application is related to and claims priority to U.S. Provisional Application No. 60/233,995, filed Sep. 20, 2000, and entitled, "Leadframe-Based Module DC Bus Design to Reduce Module Inductance," U.S. Provisional Application No. 60/233,996, filed Sep. 20, 2000, and entitled, "Substrate-Level DC Bus Design to Reduce Module Inductance," U.S. Provisional Application No. 60/233,993, filed Sep. 20, 2000, and entitled, "EMI Reduction in Power Modules Through the Use of Integrated Capacitors on the Substrate Level," U.S. Provisional Application No. 60/233,992, filed Sep. 20, 2000, and entitled, "Press (Non-Soldered) Contacts for High Electrical Connections in Power Modules," and U.S. Provisional Application No. 60/233,994, filed Sep. 20, 2000, and entitled, "Both-Side Solderable Power Devices to Reduce Electrical Interconnects." Each of the above applications is hereby incorporated by reference herein in its entirety.

BACKGROUND OF THE INVENTION

1. Field of the Invention

The invention relates to the field of electronics. More specifically, the invention relates to high frequency electromagnetic interference ("EMI").

2. Background of the Invention

An inverter is commonly used to convert direct current ("DC") to alternating current ("AC") to power a three-phase load, such as a three-phase motor, or, alternatively, to convert AC from a three-phase source to DC. The inverter commonly contains six switches. Power modules often contain one or more pairs of complementary switches. The power module typically includes silicon dice on substrates that are secured to the module baseplate. Each switching pair has a positive or "high" side switch and a negative or "low" side switch for controlling the flow of electric current. Each switching pair is referred to herein as a "half bridge." The "high side" of the bridge contains the positive switches, and the "low side" contains the negative switches. By the term "switch" is meant a switching device such as an insulated gate bipolar transistor ("IGBT") or Bipolar Junction Transistor ("BJT") or Metal Oxide Semiconductor Field Effect Transistor ("MOSFET"), either singly or in parallel.

Elements may be described herein as "positive" or "negative." An element described as "positive" is shaped and positioned to be at a higher relative voltage than elements described as "negative" when the power module is connected to a power source. "Positive" elements are positioned to have an electrical connection that is connectable to the positive terminal of a power source, while "negative" elements are positioned to have an electrical connection that is connectable to a negative terminal, or ground, of the power source. Generally, "positive" elements are located or connected to the high side of the power module and "negative" elements are located or connected to the low side of the power module.

In a typical power module configuration, the high side switches are on one side of the module opposite the corresponding low side switches. A positive DC lead from a power source such as a battery is connected to a conducting layer in the high side of the substrate. Likewise, a negative DC lead from the power source is connected to a conducting layer in the low side of the substrate. The high side switches control the flow of current from the conducting layers of each high side substrate to output leads. Output leads, called "phase terminals" transfer alternating current from the three pairs of switches, or half bridges, to the motor.

Power modules typically have three half bridges combined into a single three-phase switching module, or single half-bridge modules that may be linked together to form a three-phase inverter. As would be understood by one of ordinary skill in the art, the same DC to AC conversion may be accomplished using any number of half bridges, which correspond to a phase, and each switching pair may contain any number of switching devices. For simplicity and clarity, all examples herein use a common three phase/three switching pair configuration. However, the invention disclosed herein may be applied to a power module having any number of switches.

Current flows from the power source through the positive DC lead to the conducting layer on the high side substrate. Current is then permitted to flow through one or more switching device on the high side to a conducting layer, commonly referred to as a phase output layer, on the low side. A phase terminal lead allows current to flow from this conducting layer on the low side to the motor. The current then flows from the motor to the corresponding conducting layer on the low side of a second switching pair through the low side switches and diodes to the negative DC lead to the power source.

Current flowing through various inductive paths within the module transiently stores energy which increases energy loss, reduces efficiency, and generates heat. When the flow of current changes, as in such a high frequency switching environment, large voltage overshoots often result, further decreasing efficiency. Additional materials regarding efficient configurations of power modules may be found in application Ser. No. 09/957,568, entitled "Substrate-Level DC Bus Design to Reduce Module Inductance," application Ser. No. 09/957,047, entitled "Press (Non-soldered) Contacts for High Current Electrical Connections in Power Modules," and application Ser. No. 09/882,708, entitled "Leadframe-Based Module DC Bus Design to Reduce Module Inductance," which are hereby incorporated by reference in their entirety.

To minimize the negative effects of current gradients, noise and voltage overshoots associated with the switching process of the module, large capacitors are generally placed in a parallel arrangement between the positive and negative DC connections or from each DC connection to a ground or chassis. These large capacitors are commonly referred to as "X" or "Y" capacitors. Relatively large external capacitors of about around 100 micro Farads are needed. By "external" it is meant that the element referred to is located outside of a power module. High frequency noise, and voltage overshoots that are initiated in the module by the switching process travel away from the source of the noise and voltage overshoots. A low impedance network may be used to provide a return path for the high frequency energy associated with noise and voltage overshoots. The further the energy travels, the more difficult it is to provide a low impedance network to return the energy. Therefore, capacitors attached between the positive and negative DC connections or from the DC connections to ground must be relatively large to minimize the impact of noise, and voltage overshoots. In addition, these external capacitors typically cause stray inductance, which renders the capacitor ineffective at frequencies higher than about 10 kHz.

These and other problems are avoided and numerous advantages are provided by the method and device described herein.

BRIEF SUMMARY OF THE INVENTION

The present invention provides high frequency, low impedance network for use in a power module for reducing radiated and conducted electromagnetic interference and the resulting noise and voltage overshoots. By "a high frequency, low impedance network" it is meant any structure characterized by an equivalent impedance below about 10 nanoHenry ("nH"), and typically between about 100 pico-Henry and about 10 nH, in a frequency range from between about 10 Mega Hertz ("MHz") to about 1 Giga Hertz ("GHz"). Because the high frequency, low impedance is located relatively close to the source of noise and voltage overshoots inherent in the switching process, a much smaller capacitance may be used with more effective reduction of noise and voltage overshoots when compared to larger, external capacitors.

Elements may be described herein as "adjacent" to another element. By the term "adjacent" is meant that in a relationship so characterized, the components are located proximate to one another, but not necessarily in contact with each other. Normally there will be an absence of other components positioned in between adjacent components, but this is not a requirement. By the term "substantially" is meant that the orientation is as described, with allowances for variations that do not effect the cooperation and relationship of the so described component or components.

In accordance with the present invention, a method for reducing electromagnetic interference in a power module is provided. A high frequency, low impedance network is electrically connected to at least one of a positive conducting layer in a substrate or a negative conducting layer in a substrate. The high frequency, low impedance network is also electrically connected to ground.

In another aspect, a device is provided for reducing electromagnetic interference in a power module. The device includes a surface mount capacitor, a first electrical connection from the surface mount capacitor to at least one of a positive conducting layer in a high side substrate of a power module or a negative conducting layer in a low side substrate of a power module, and a second electrical connection from the surface mount capacitor to ground.

In one aspect, the first electrical connection is a soldered connection.

In another aspect, the second electrical connection includes a via connection from the surface mount capacitor to an electrically grounded layer in the substrate of a power module. In still another aspect, the second electrical connection includes an electrically isolated substrate layer soldered to the surface mount capacitor and a wire bond from the electrically isolated layer to a ground connection in a power module. Preferably, the surface mount capacitor is between about 1 and about 100 nano Ferads.

In yet another aspect of the invention, a power module for reducing inductance is disclosed. The module has a lead frame for supporting the module and for providing interconnections to the motor and the power source. A substrate, which includes a high side substrate and a low side substrate, is connected to the lead frame. High side switches are proximate to the high side substrate and low side switches are proximate to the low side substrate. A positive conducting layer in the high side substrate is configured for connection to a positive bus and a negative conducting layer in the low side substrate is configured for connection to a negative bus. A capacitor is electrically connected to at least one of the positive conducting layer or the negative conducting layer, and a ground is electrically connected to the substrate.

According to the invention, the method, device and power module disclosed herein provide improved efficiency and more even motor performance through the reduction of electromagnetic interference in a power module. Because the capacitor is located in the substrate of the power module, a smaller and less expensive capacitor arrangement may be used to reduce electromagnetic inductance.

These and other advantages will become apparent to those of ordinary skill in the art with reference to the detailed description and drawings.

DETAILED DESCRIPTION OF THE INVENTION

In accordance with the invention, a high frequency, low impedance network is used in a power module. The capacitance is shaped and positioned to minimize effects of electromagnetic interference and its associated voltage overshoots and noise. Reference is made herein to a power module with three phase terminals for use with a three-phase load, such as a three-phase motor, and having three half-bridges, each with one switching pair. As will be appreciated by one of ordinary skill in the art, the disclosed device, power module, DC bus, and method for reducing inductance in a power module could be used on a power module with any number of phase terminals and bridges, and having any number of switching pairs. Nonetheless, for ease of description, reference is made to a three-phase power module.

Figure 1:
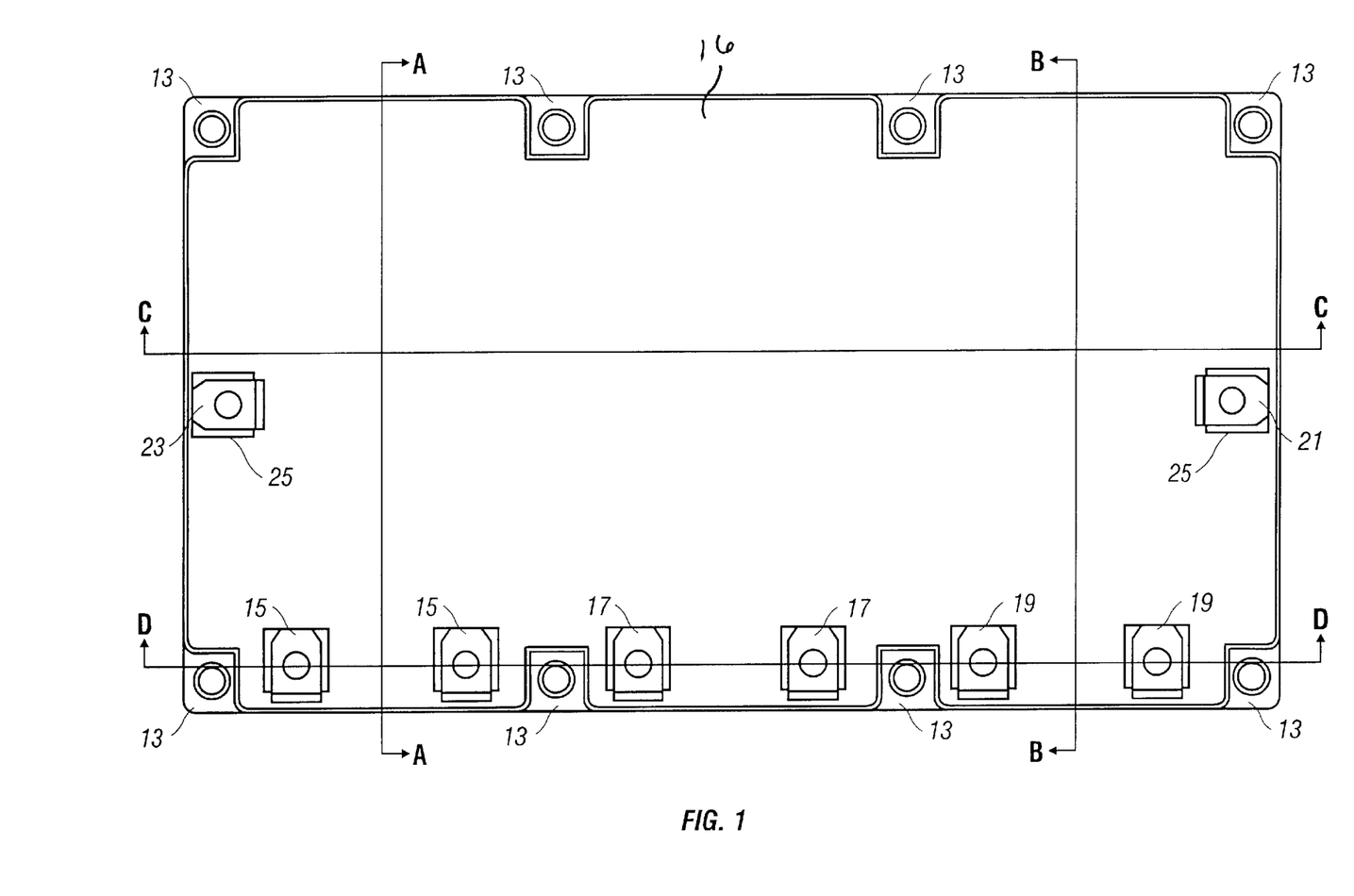
FIG. 1 is an overhead view of the top of the power module.

Referring to FIG. 1, an overhead view of the top of the power module is shown. The module has a positive lead 21 that is connectable to a power source, such as a battery, and a negative lead 23 that is likewise connectable to the negative terminal of a power source such as a battery, or ground. The module has three sets of phase terminals 15, 17, and 19. The top of the power module is held in place by fasteners (not shown) through bushings 13. The fasteners are bolts, but other types of fasteners can be substituted therefore, as will be readily apparent to those of ordinary skill in the art. A non-conducting strip 25 holds leads 21 and 23 in place by providing a raised portion into which fasteners through 21 and 23 may be secured.

As will be understood by one of ordinary skill in the art, the positive leads 21 and negative leads 23 carry direct current from a battery source to the module. As will be better understood by the following discussion, the power module converts the direct current to alternating current, or alternating current to direct current. In a three-phase module such as that shown in FIG. 1, there are at lease three phase terminals 15, 17 and 19 through which the resulting alternating current flows. In the preferred embodiment, there are three pairs of phase terminals 15, 17, and 19.

Figure 2:
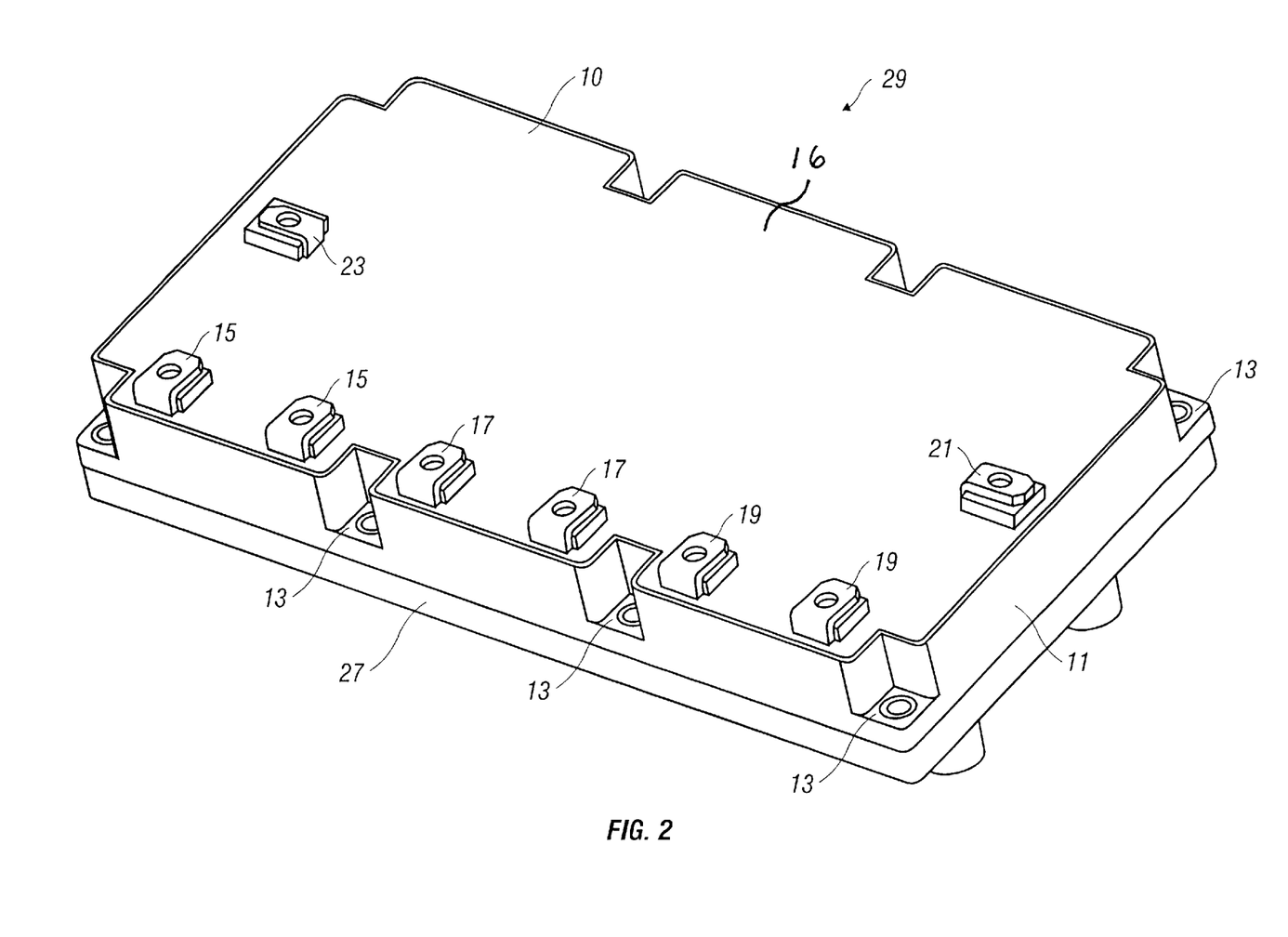
FIG. 2 is a perspective view of the power module.

FIG. 2 is a perspective view of the power module 29. The module has a module frame 11 and top cover 10, which are preferably composed of plastic. The bottom portion is the cooling header 27 of the module, into which a cooling liquid enters, circulates through, and exits, for cooling the module. Sandwiched between the module frame 11 and the cooling header 27 middle portion is the base plate, which contains the substrate, and switching devices, and is not shown in this view. FIG. 2 shows the positive lead 21 and negative lead 23, and phase terminals 15, 17, and 19. The module frame 11 is bolted to the cooling header 27 with bushings 13.

Figure 3:
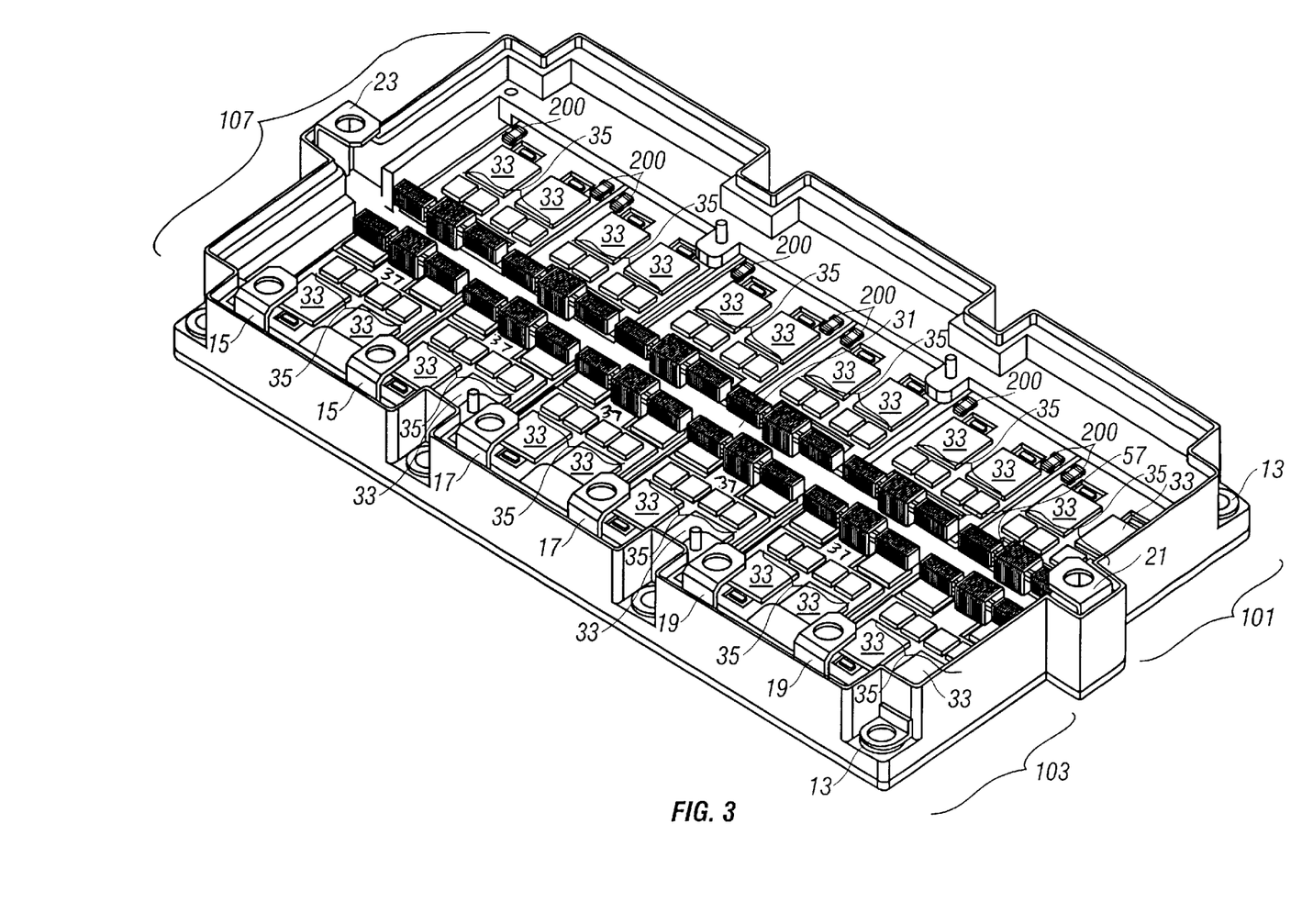
FIG. 3 is a perspective view of the power module without its top portion and with the substrates exposed.

FIG. 3 is a perspective view of the power module, shown without its top cover portion 10 and with the printed circuit board removed. The DC bus 31 has a separate positive bus plate and a negative bus plate. The DC bus 31 is arranged parallel to the substrate 107. However, any number of DC bus arrangements may be used in place of DC bus 31. For example, the DC bus may be located outside the power module. For a discussion of the DC bus 31, see copending application Ser. No. 09/957,568, entitled "Substrate-Level DC Bus Design to Reduce Module Inductance." For a discussion of an alternative arrangement of a DC bus, see application Ser. No. 09/882,708.

As would be understood by one of ordinary skill in the art, the substrate has conducting layers separated by an insulating layer for carrying and controlling a current flow. The substrate 107 has a high side 101, which includes a substrate, and a low side 103, which also includes a substrate. Switches 33, which can be IGBTs, BJTs, or MOSFETs, and diodes 35 for controlling current flow are electrically connected to the substrate 107. The switches 33 are preferably IGBTs. The switches 33 and diodes 35 are electrically connected, preferably by wire bonding.

As will be understood by one of ordinary skill in the art, direct current flows from a power source such as a battery to the positive DC leads 21 and to the DC conductor bus plates 31. Current flows to a conducting layer in the high side 101 of the power module. The current flows through the switches 33 and diodes 35 on the high side 101 through a conducting plate 37. The conducting plate 37 is connected to a conducting layer in the low side 103 of the power module by a phase conducting layer within the parallel bus bar 31. Current then flows from the conducting layer on the low side 103 through one of the sets of phase terminals 15, 17, or 19 to a three-phase motor (not shown). Current from the motor flows back to a different set of phase terminals 15, 17, or 19, where it flows from the conducting layer on the low side 103 through the low side switches 33, 35 to the negative lead 23 of the bus bar 31 and back to the power source.

FIG. 3 also shows pairs of phase terminals 15, 17, and 19. Three single phase terminals may be substituted for phase terminal pairs 15, 17, and 19. Alternatively, each phase terminal grouping, shown as pairs 15, 17, and 19, may include more than two phase terminals. Pairs of phase terminals 15, 17, and 19 are used for ease of connecting to switches 33 on the high side 101 of the power module. Surface mount capacitors 200 are shown on the substrate of the low side 103 of the power module. The surface mount capacitors 200 are electrically connected to a negative conducting layer in the low side 103, which is shown in more detail in FIGS. 12–14.

A positive DC lead 21 and a negative DC lead 23 are also shown. Each lead 21 and 23 is placed central to a switching substrate corresponding to each of the phase terminals 15, 17, or 19.

Figure 4:
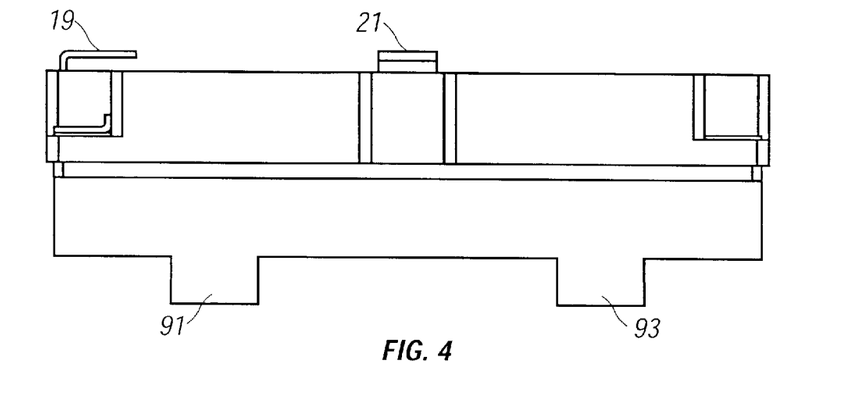
FIG. 4 is the side view of the power module.

FIG. 4 is a side view of the power module, with DC leads 21 and 23, phase terminal 15, and module frame 11. The bottom cooling header 27 includes an intake for coolant 91 and an outlet for coolant 93.

Figure 5:
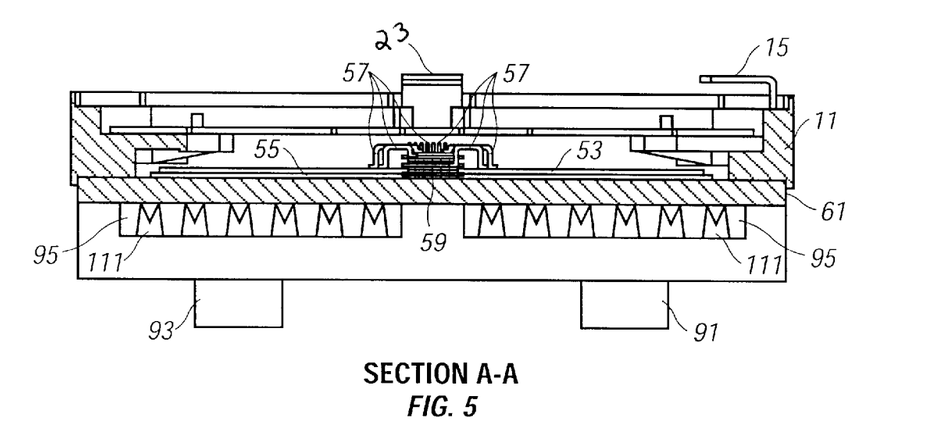
FIG. 5 is a cross-sectional front view of the power module with cooling intake and outlet.

Referring now to FIG. 5, a cross-sectional front view of the power module with cooling intake 91 and outlet 93 is shown. The cooling header 27 includes a cavity 95 through which a coolant, such as water, may flow. The cavity 95 includes thermal conducting projections 111. The cooling header 27 is fastened to the base plate 61, which supports the high side switching assembly 55 and low side switching assembly 53. The high side switching assembly 55 and low side switching assembly 53 comprise a single half bridge. The phase terminal 15 is also shown. FIG. 5 illustrates the cross section of the DC bus at the point having a positive DC lead 21. The DC bus has conducting layers 59 arranged parallel to the high and low side switching assemblies 53 and 55. The conducting layers 59 of the DC bus are explained in more detail in application Ser. No. 09/957,568, entitled "Substrate-Level DC Bus Design to Reduce Module Inductance," and include a positive plate, a negative plate, and a phase conducting layer. Connectors 57 connect the various conducting layers 59 of the DC bus to corresponding conducting layers in the high side switching assembly 55 and the low side switching assembly 53. The conducting layers are separated by electrically insulating layer, preferably made from plastic or tape. Alternatively, enough space may be left between the conducting layers to provide an insulating layer of air or silicone gel. The electrically insulating layers permit more uniform spacing and closer spacing between the conducting layers. However, other alternative DC bus configurations may be used.

Because the positive plate and negative plate within the conducting layers 59 are parallel, counter flow of current is permitted, thereby canceling the magnetic fields and their associated inductances. In addition, the parallel bus plates in the conducting layers 59 construct a distributed capacitance. As will be understood by one of ordinary skill in the art, capacitance dampens voltage overshoots that are caused by the switching process. Thus, the conducting layers 59 create a magnetic field cancellation as a result of the counter flow of current, and capacitance damping as a result of also establishing a functional capacitance between them. FIG. 5 shows the DC bus plates 57 and 59 placed parallel to the high and low side substrates 53 and 55, however, the DC bus plates 57 and 59 may also be placed perpendicular to the substrates 53 and 55 and still achieve counter flow of current and reduced inductances, as described in more detail in application Ser. No. 09/882,708.

The cooling system is further illustrated in FIG. 5. Heat produced by the power module is conducted through the base plate 61 and the conducting projections 111 to the coolant cavities 95. Coolant flows into the coolant intake 91, through the cavities 95, and out coolant intake 93, thereby dissipating heat energy from the power module.

Figure 6:
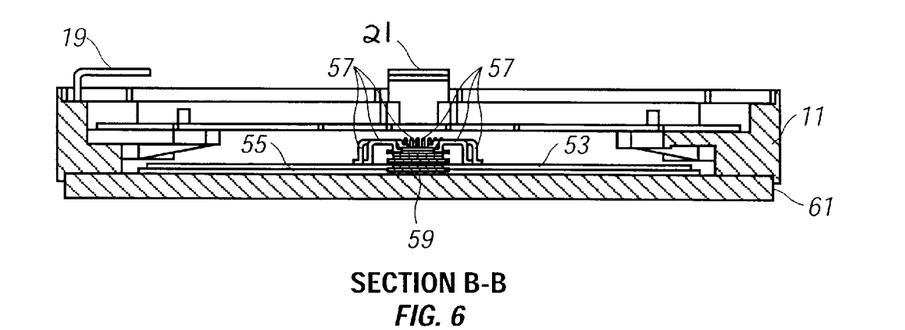
FIG. 6 is a cross-sectional front view of the power module without cooling intake and out take.

Referring now to FIG. 6, a cross-sectional front view of the power module without cooling intake and out take is shown.

Figure 7:
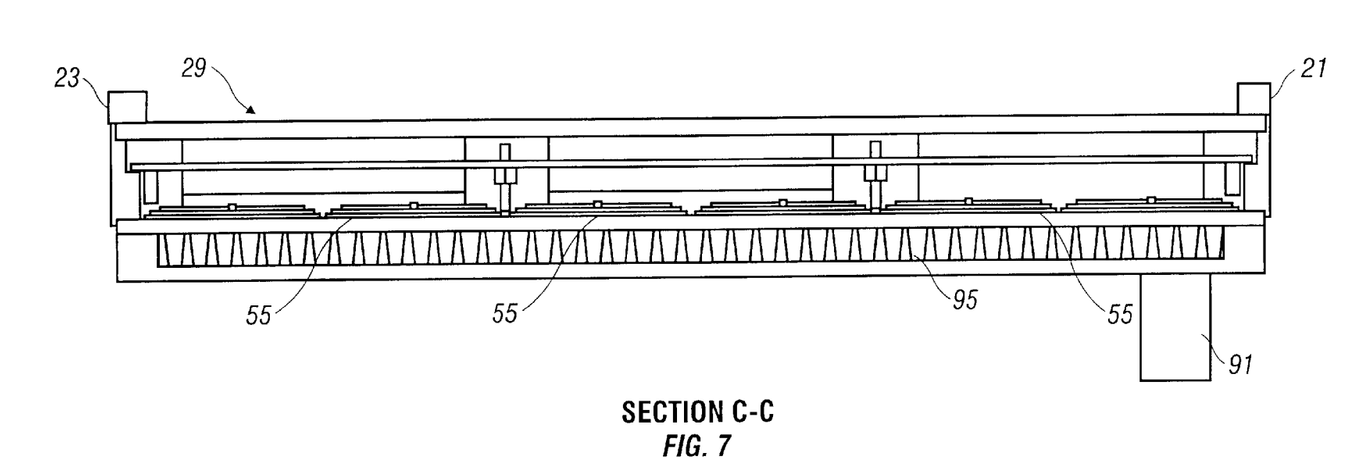
FIG. 7 is a cross-sectional side view of the power module viewed through the DC bus leads.

Turning now to FIG. 7, a cross-sectional side view of the power module is shown. The coolant cavity 95 runs the length of the module to intake 91. The high side substrate switches 55 are shown inside the module 29 with positive DC lead 21 and negative DC lead 23.

Figure 8:
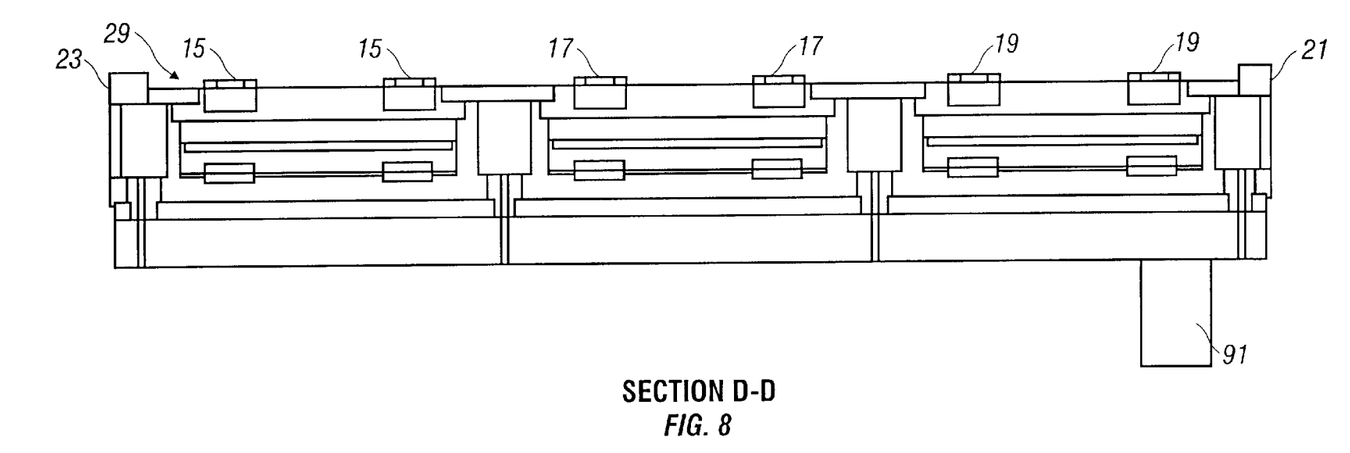
FIG. 8 is a cross-sectional side view of the power module viewed through the phase terminals.

FIG. 8 is a cross-sectional side view of the power module viewed through the phase terminals 15, 17, and 19 and depicting positive DC bus lead 21 and negative DC bus lead 23.

Figure 9:
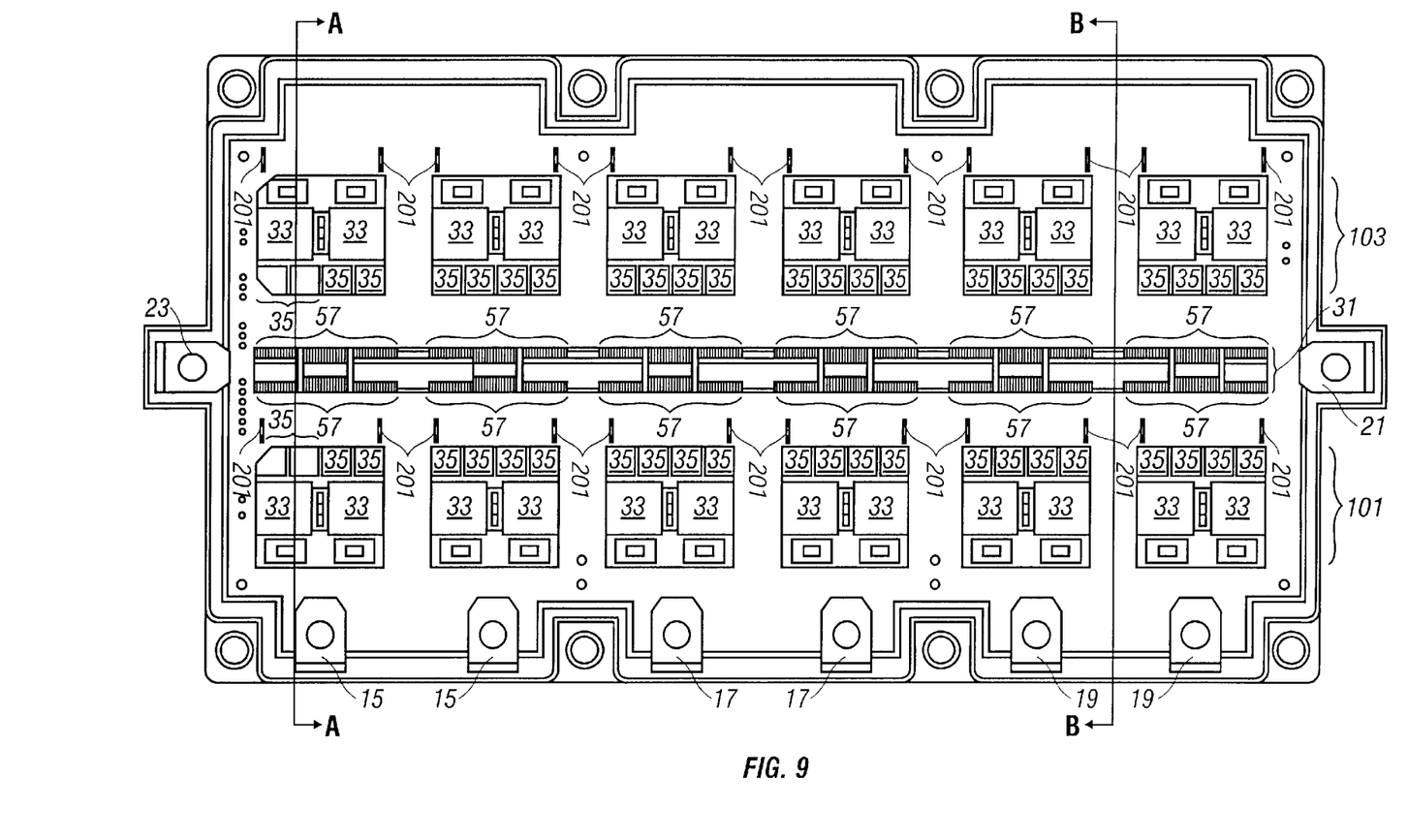
FIG. 9 is a top section view of the module with the printed circuit board in place.

FIG. 9 is a top section view of the printed circuit board illustrating switching devices 33 and diodes 35 on the substrate of the module as viewed through cutouts in the printed circuit board. The DC bus 31 is shown in the center of the module. Positive lead 21, negative lead 23 and phase terminals 15, 17, and 19 are also shown. Various conducting layers in the DC bus 31 are connected to conducting layers in the module by connectors 57. Capacitors 200 and 201 are shown on the substrate level of the module. Capacitors 200 are electrically connected to a negative conducting layer in the low side 103 of the substrate, and capacitors 201 are electrically connected to s positive conducting layer in the high side 101 of the substrate, as shown in more detail in FIGS. 12–13.

Figure 10:
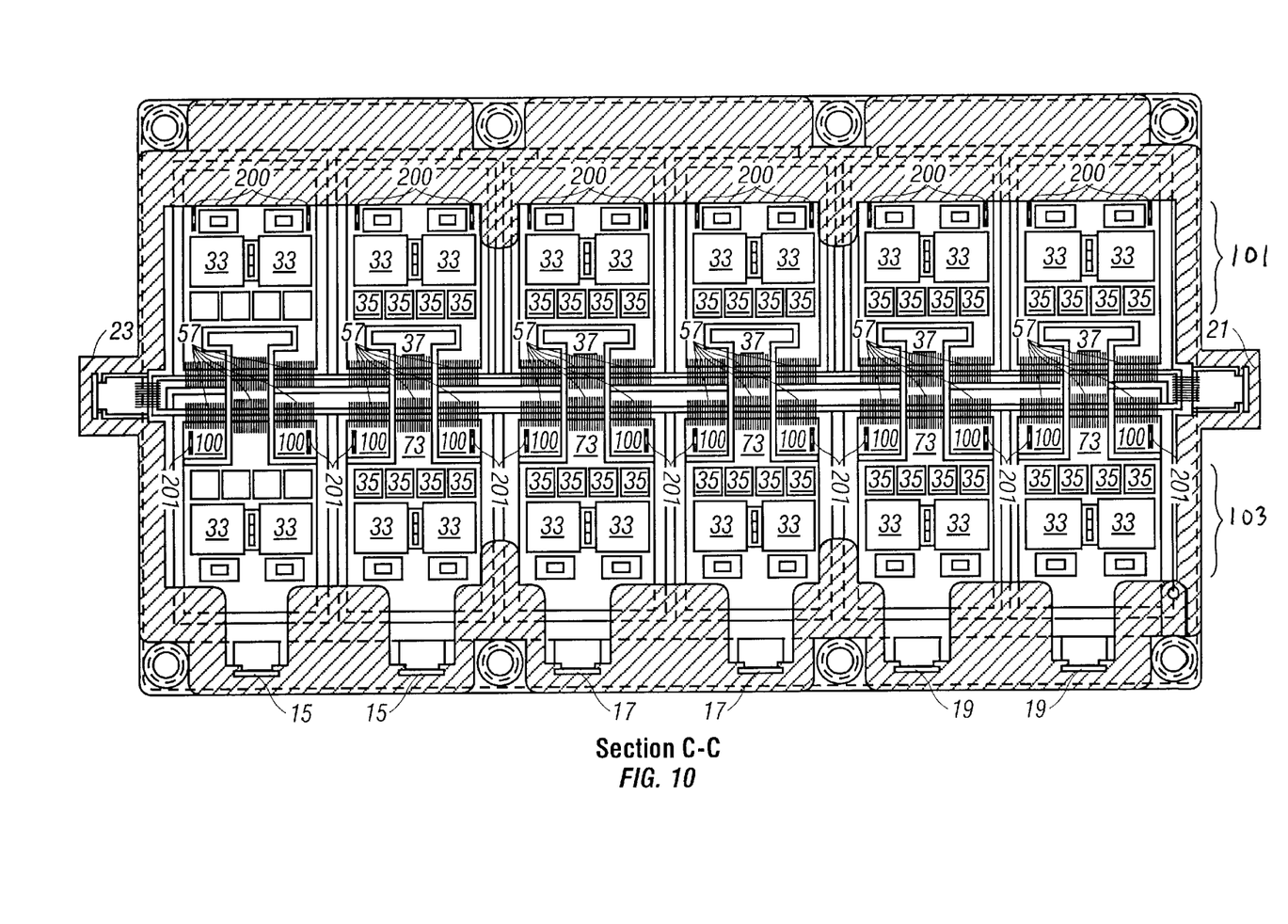
FIG. 10 is a top section view of the module showing the substrates without the printed circuit board.

Referring now to FIG. 10, a top section view of the module below the printed circuit board is shown. The DC bus 31 is shown placed in the middle of the module for symmetric flow of current to both sides of switches 33 and diodes 35. The DC bus 31 has conducting layers, including a positive bus plate, a negative bus plate, and a phase conducting layer, shown in more detail in FIG. 12. The conducting layers of the DC bus 31 are connected to the high side 101 and the low side 103 through connections 57. The connections 57 are preferably wire bonds, but other connections may be substituted for wire bonds. The phase conducting layer of the DC bus 31 allows current to flow from the high side 101 to the low side 103 through connections 57.

Substrate switches 33 and diodes 35 are shown on a substrate. As would be apparent to one of ordinary skill in the art, the current must be able to flow from the conducting layer on the high side 101 of the substrate to the conducting layer on the low side 103 of the substrate. The current flows from a conducting layer of the substrate on the high side 101, through the switches 33 and diodes 35 to a conducting plate 37. The conducting plate 37 is connected to the DC bus 31, and more specifically to the phase conducting layer of the DC bus, through connections 57. The phase conducting layer of the DC bus is also connected through connections 57 to a second conducting plate 73 on the low side 103 of the module. The load current is returned through switches 33 to the negative bus plate 100. In other words, the high side 101 is connected to the low side 103 through conducting plate 37 via connections 57 to the phase conducting layer of the DC bus 31. The phase conducting layer of the DC bus 31 is in turn connected to the second conducting plate 73 on the low side 103 via connections 57.

Figure 12:
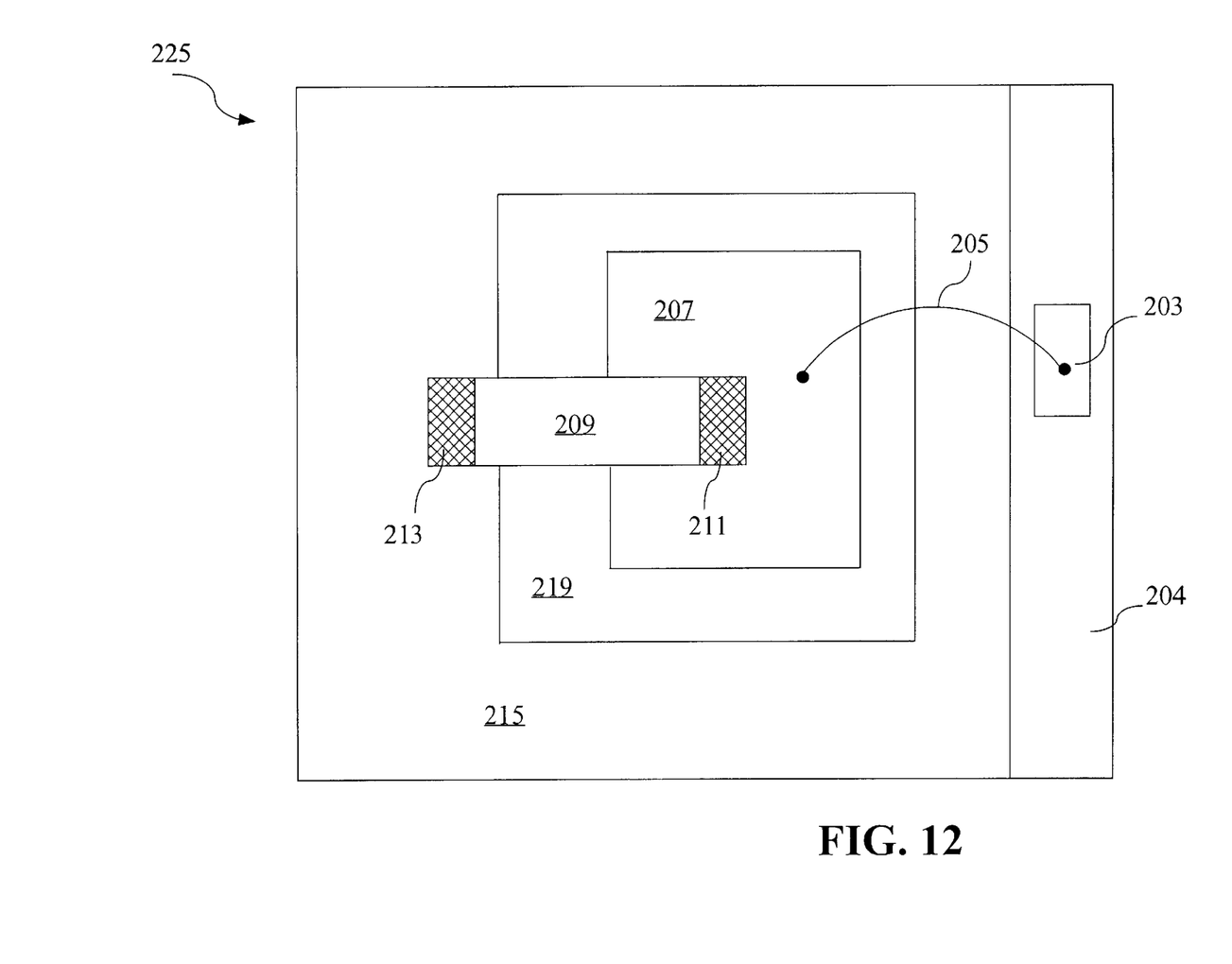
FIG. 12 is an overhead view of one embodiment of a substrate where a capacitor is electrically connected to an electrically isolated substrate layer and wire bonded to a ground in the lead frame.
Figure 13:
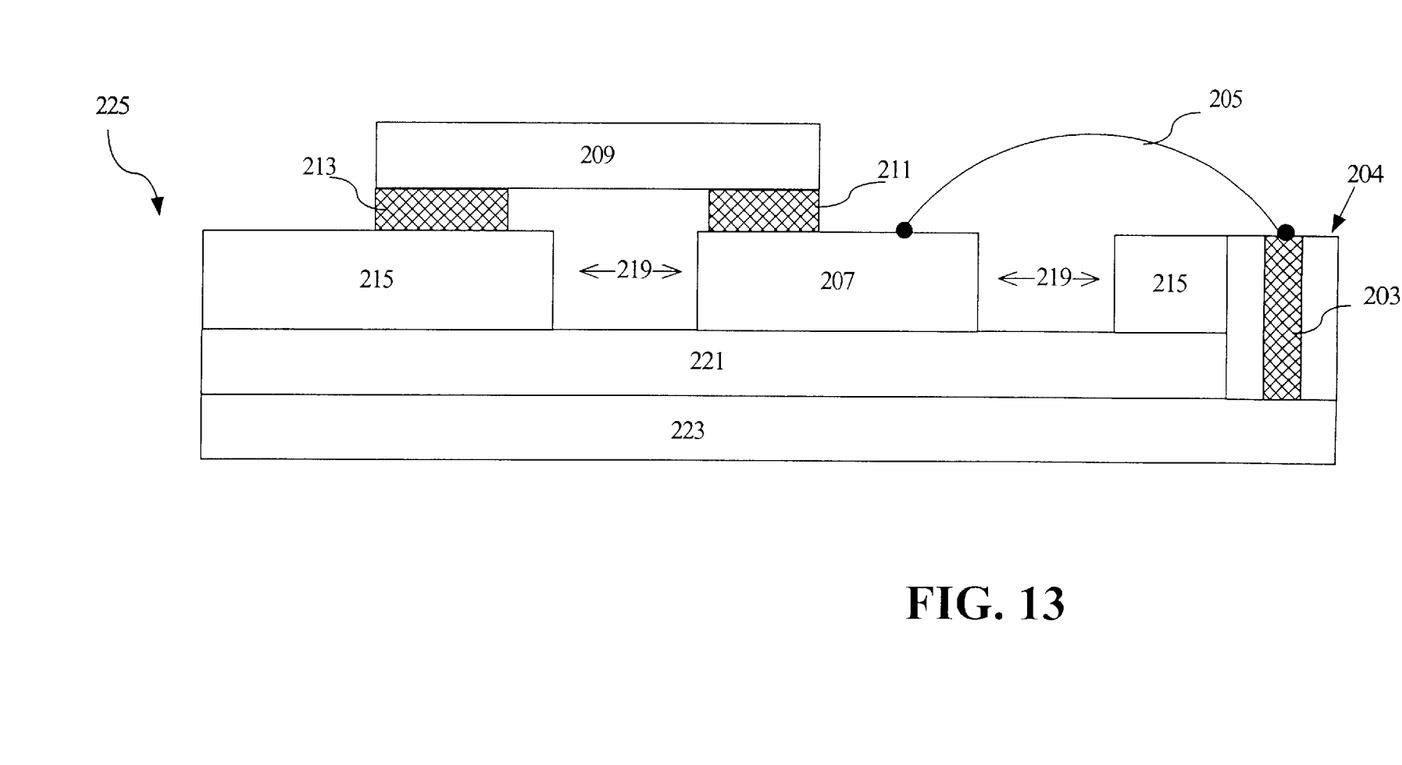
FIG. 13 is a cross sectional view of one embodiment of a substrate where a capacitor is electrically connected to an electrically isolated substrate layer and wire bonded to a ground in the lead frame.

Capacitors 201 are electrically connected to a negative conducting layer 100 in the low side 103 of the substrate, and capacitors 201 are electrically connected to a positive conducting layer in the high side 101 of the substrate, as shown in more detail in FIGS. 12–13. Surface mount capacitors 200 and 201 may be placed at various locations on the negative conducting layer 100 in the low side 103 of the substrate or the positive conducting layer in the high side 101 of the substrate. However, in the embodiment shown, preferably, capacitors 200 and 201 are placed proximate to the DC bus.

Figure 11:
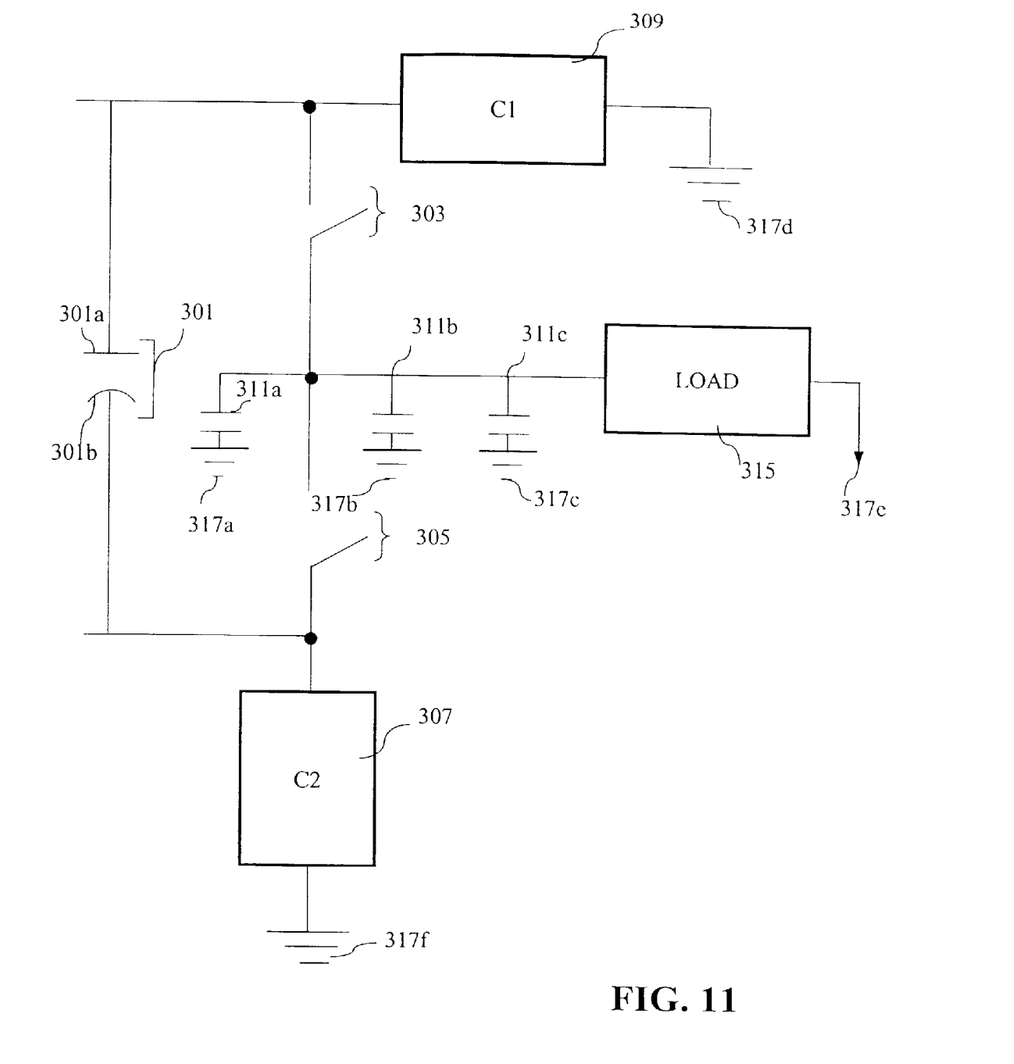
FIG. 11 is a power module circuit diagram of an embodiment of the invention.

Referring now to FIG. 11, a power module circuit diagram illustrating the method for reducing electromagnetic interference in a power module is shown. The circuit has a DC bus 301 with a positive DC bus plate 301a and a negative DC bus plate 301b. The DC bus 301 is electrically connected to high side switches 303 and low side switches 305 in a power module. As previously discussed, the high side switches 303 and low side switches 305 in a power module typically include a configuration of IGBTs and diodes, such as the configuration shown in FIGS. 3, 9, and 10. The switches are connected to a load 315, such as a three-phase motor, which is in turn, connected to a ground 317e.

Capacitors 311a–c and grounds 317a–c represent parasitic capacitance inherent in the power module. Capacitor 309 is electrically connected to the high side of the power module and high side switches 305 and ground 317d to offset the electromagnetic interference inherent in the switching process. Likewise, capacitor 307 is electrically connected to the low side of the power module and low side switches 305 and ground 317f.

Capacitors 311a–c also function as amplifiers that amplify the electromagnetic interference and its associated voltage overshoots, noise, and ripple currents inherent in the switching process. Therefore, the further away that capacitors 307 and 309 are located from the switching process, i.e., the module substrate, the larger capacitors 307 and 309 must be in order to effectively minimize the negative effects of electromagnetic interference. For example, if capacitors 309 and 307 are attached to the DC bus 301 outside the power module, capacitors of about 100 micro Farads are needed.

However, if capacitors 307 and 309 are electrically connected to the substrate level of a power module, relatively smaller capacitors, for example, capacitors of about 100 nano Ferads may be used. In one embodiment, a surface mount capacitor is electrically connected to at least one of a positive conducting layer in a high side substrate of a power module or a negative conducting layer in a low side substrate of a power module. The capacitor is then connected to ground.

FIG. 12 is an overhead view of one embodiment of a substrate 225 in accordance with the invention. A capacitor 209 is electrically connected to a conducting layer 215 in a substrate 225 by first connection 213. The conducting layer 215 may be either a positive conducting layer in the high side of the substrate 225 or a negative conducting layer in the low side of a substrate 225. Preferably, first connection 213 is a soldered connection from the base of the capacitor 209 to the face of conducting layer 215. The capacitor 209 is also electrically connected to an electrically isolated substrate layer 207 by second connection 211. Preferably, second connection 213 is a soldered connection from the base of the capacitor 209 to the face of the electrically isolated layer 207.

The electrically isolated substrate layer 207 is electrically isolated from conducting layer 215 by an etched area 219. Electrical isolation may be achieved by etching conducting layer 215 to expose an etched area 219 and an electrically isolated substrate layer 207. Electrically isolated layer 207 is electrically connected to a grounded area 203 in the lead frame 204 of the module. Preferably, a wire bond 205 is used to electrically connect electrically isolated substrate layer 207 to a grounded area 203 in the lead frame 204 of the module.

FIG. 13 is a cross sectional view of one embodiment of a substrate. The substrate 225 includes a grounded layer 223, and a dielectric layer 221. The etched area 219 electrically isolates the electrically isolated layer 207 from the conducting layer 215. A capacitor 209 is electrically connected to the conducting layer 215 of the substrate 225 by a first connection 213, and an electrically isolated substrate layer 207 by a second connection 211. The electrically isolated layer 207 is connected to a grounded area 203 of the lead frame, preferably by a wire bond 205. The grounded area 203 is electrically connected to the grounded layer 223 in the substrate.

Figure 14:
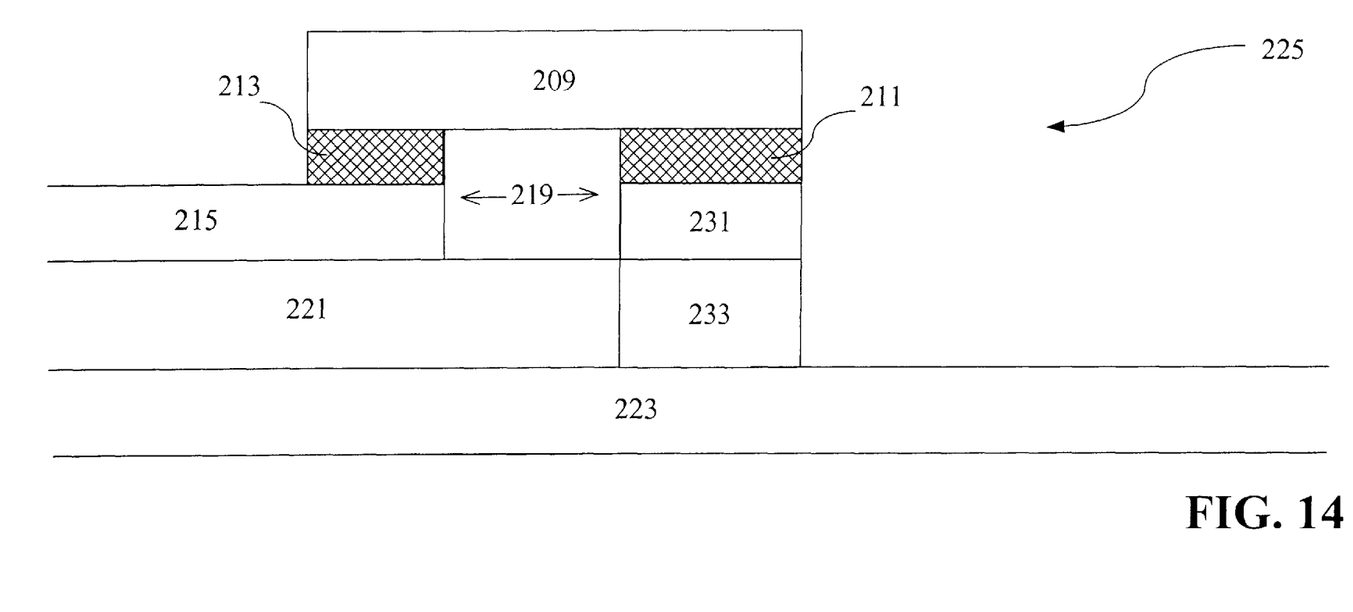
FIG. 14 is a cross sectional view of one embodiment of a substrate where a capacitor is electrically connected to a grounded layer in a substrate with a via connection.

FIG. 14 is a cross sectional view of one embodiment of a substrate 225 according to the present invention. The substrate 225 includes a grounded layer 223 and a dielectric layer 221. The substrate 225 also includes a conducting layer 215. The conducting layer 215 may be either a positive conducting layer in the high side of the substrate 225 or a negative conducting layer in the low side of a substrate 225. The substrate 225 includes an etched area 219 for electrically isolating conducting layer 215 and isolated area 231.

A capacitor 209 is electrically connected to the conducting layer 215 by a first connection 213. Preferably, the first connection 213 is a soldered connection. The capacitor 209 is also connected to the isolated area 231 by a second connection 211. Preferably, the first connection 213 and the second connection 211 are soldered connections. The isolated area 231 is in turn electrically connected to a via 233, which is electrically connected to the grounded layer 233. As would be understood by one of ordinary skill in the art, a via is a connection between layers in a substrate.

Preferably, electrically conducting layers of the substrate 225 such as the grounded layer 223, the conducting layer 215, and the isolated area 231 include copper. Preferably, the dielectric layer 221 is aluminum nitride.

The figures disclosed herein are merely exemplary of the invention, and the invention may be embodied in various and alternative forms. The figures are not necessarily to scale. Some features may be exaggerated or minimized to show details of particular components. Therefore, specific structural and functional details disclosed herein are not to be interpreted as limiting, but merely as a basis for the claims and as a representative basis for teaching one skilled in the art to variously employ the present invention.

Having thus described the invention, the same will become better understood from the appended claims in which it is set forth in a non-limiting manner.

What is claimed is:

1. A power module for reducing inductance in transferring power between a power source and a motor, the power module comprising:

a lead frame for supporting the power module and for providing interconnections to the motor and the power source;

a substrate connected to the lead frame comprising a high side substrate and a low side substrate;

high side switches proximate to the high side substrate;

low side switches proximate to the low side substrate;

a positive conducting layer in the high side substrate of the power module configured for connection to a positive bus;

a negative conducting layer in the low side substrate of the power module configured for connection to a negative bus; and a high frequency, low impedance network comprising a ground.

2. A power module for reducing inductance in transferring power between a power source and a motor, the power module comprising:

a lead frame for supporting the power module and for providing interconnections to the motor and the power source;

a substrate connected to the lead frame comprising a high side substrate and a low side substrate;

high side switches proximate to the high side substrate;

low side switches proximate to the low side substrate;

a positive conducting layer in the high side substrate of the power module configured for connection to a positive bus;

a negative conducting layer in the low side substrate of the power module configured for connection to a negative bus; and a high frequency, low impedance network comprising a ground and a surface mount capacitor surface mounted to the ground and to at least one of the positive conducting layer or the negative conducting layer.

3. The power module of claim 2, further comprising:

a via connection; and a ground layer in the substrate, the ground electrically connected to the ground layer by the via connection.

4. The power module of claim 2, wherein the ground is an electrically isolated layer in the substrate, and further comprising:

a grounded area in the lead frame; and a wire bond from the electrically isolated layer in the substrate to the ground connection mounted in the lead frame.

* * * * *